United States Patent
Ye

(10) Patent No.: US 9,553,436 B2
(45) Date of Patent: Jan. 24, 2017

(54) FLOOR BOX COVER

(71) Applicant: Thomas & Betts International, LLC, Wilmington, DE (US)

(72) Inventor: Zachary Ye, Shanghai (CN)

(73) Assignee: Thomas & Betts International LLC, Wilmington, DE (US)

( * ) Notice: Subject to any disclaimer, the term of this patent is extended or adjusted under 35 U.S.C. 154(b) by 0 days.

(21) Appl. No.: 14/721,130

(22) Filed: May 26, 2015

(65) Prior Publication Data

US 2015/0380915 A1 Dec. 31, 2015

(30) Foreign Application Priority Data

Jun. 25, 2014 (CN) .......................... 2014 1 0290522

(51) Int. Cl.
| | |
|---|---|
| H02G 3/14 | (2006.01) |
| H02G 3/08 | (2006.01) |
| H02G 3/18 | (2006.01) |
| H05K 5/06 | (2006.01) |

(52) U.S. Cl.
CPC ................ *H02G 3/14* (2013.01); *H02G 3/185* (2013.01); *H05K 5/061* (2013.01)

(58) Field of Classification Search
CPC ............ H02G 3/14; H02G 3/185; H02G 3/12; H02G 3/088; H02G 3/18
USPC ... 220/241, 242, 3.2, 3.3, 3.8; 439/535, 536; 174/66, 67, 50, 50.51, 50.52, 520, 564, 174/53, 480–490
See application file for complete search history.

(56) References Cited

U.S. PATENT DOCUMENTS

| | | | |
|---|---|---|---|
| 3,029,964 A * | 4/1962 | Hudson ................. | H02G 3/185 138/92 |
| 3,144,066 A | 8/1964 | Van Hecke | |
| 3,221,794 A | 12/1965 | Acres | |
| 3,318,476 A * | 5/1967 | Clark ..................... | E04F 19/08 174/488 |
| 3,638,980 A | 2/1972 | Kleinhenn | |
| 3,770,036 A | 11/1973 | Sherman | |
| 3,777,358 A | 12/1973 | Matievich et al. | |
| 4,036,389 A | 7/1977 | Pate et al. | |
| 4,331,832 A * | 5/1982 | Curtis .................... | H02G 3/185 174/57 |
| 4,478,478 A | 10/1984 | Durand et al. | |
| 4,770,643 A | 9/1988 | Castellani et al. | |
| 4,783,577 A | 11/1988 | Mohr | |
| 5,032,690 A | 7/1991 | Bloom | |
| 5,094,579 A * | 3/1992 | Johnson ................. | F02B 77/00 411/107 |

(Continued)

*Primary Examiner* — Dimary Lopez Cruz
(74) *Attorney, Agent, or Firm* — Taft Stettinius & Hollister LLP

(57) ABSTRACT

A floor box cover includes a base plate that engages an electrical device and a cover plate connected to the base plate. The cover plate includes a first opening to expose the electrical device and a second opening to receive a lid. A connector is inserted into an aperture in the lid and engages the cover plate to secure the lid within the second opening, causing the lid to conceal the first opening. A connector gasket engages the connector to prevent the connector from being easily removed from the lid. The connector gasket may be compressed within the aperture to seal the aperture when the connector engages the cover plate. A compressible ring gasket may be friction fit within the second opening, and when the connector engages the cover plate, the lid may compress the ring gasket to seal the second opening.

20 Claims, 12 Drawing Sheets

(56) References Cited

U.S. PATENT DOCUMENTS

| | | |
|---|---|---|
| 5,147,979 A | 9/1992 | Yang |
| 5,160,808 A | 11/1992 | Hadfield |
| 5,272,278 A | 12/1993 | Wuertz |
| 5,285,009 A | 2/1994 | Bowman et al. |
| 5,513,603 A | 5/1996 | Ang et al. |
| 5,518,768 A | 5/1996 | Wallace et al. |
| 5,651,824 A | 7/1997 | Wallace et al. |
| 5,907,124 A | 5/1999 | Reiker |
| 5,932,844 A | 8/1999 | MacAller et al. |
| 6,018,126 A | 1/2000 | Castellani et al. |
| 6,066,805 A | 5/2000 | Bordwell et al. |
| 6,114,623 A | 9/2000 | Bonilla et al. |
| 6,179,634 B1 | 1/2001 | Hull et al. |
| 6,307,152 B1 | 10/2001 | Bonilla et al. |
| 6,450,353 B1 | 9/2002 | Riedy et al. |
| 6,545,215 B2 | 4/2003 | Young et al. |
| 6,552,262 B2 | 4/2003 | English et al. |
| 6,612,081 B2 | 9/2003 | Cole et al. |
| 6,854,226 B2 | 2/2005 | Cole et al. |
| 6,878,877 B1 | 4/2005 | Cozzi et al. |
| 7,064,268 B2 | 6/2006 | Dinh |
| 7,082,729 B2 | 8/2006 | Cole et al. |
| 7,105,745 B2 * | 9/2006 | Drane ............... H02G 3/088 174/488 |
| 7,166,798 B2 | 1/2007 | Cole |
| 7,193,160 B2 | 3/2007 | Dinh |
| 7,290,971 B2 | 11/2007 | Bakos |
| 7,319,193 B2 | 1/2008 | Halterman |
| 7,326,014 B2 | 2/2008 | Levey et al. |
| 7,351,910 B1 | 4/2008 | Magisano et al. |
| 7,361,833 B2 | 4/2008 | Dinh |
| 7,503,979 B2 | 3/2009 | Haller et al. |
| 7,950,887 B2 | 5/2011 | Dietz et al. |
| 8,063,317 B2 | 11/2011 | Bowman |
| 8,202,030 B2 | 6/2012 | Walton et al. |
| 8,241,074 B2 | 8/2012 | Watford et al. |
| 8,242,365 B2 | 8/2012 | Galasso et al. |
| 8,641,341 B2 | 2/2014 | Copper et al. |
| 2005/0201848 A1 | 9/2005 | Reilly |
| 2010/0307294 A1 | 12/2010 | Schlegel et al. |

* cited by examiner

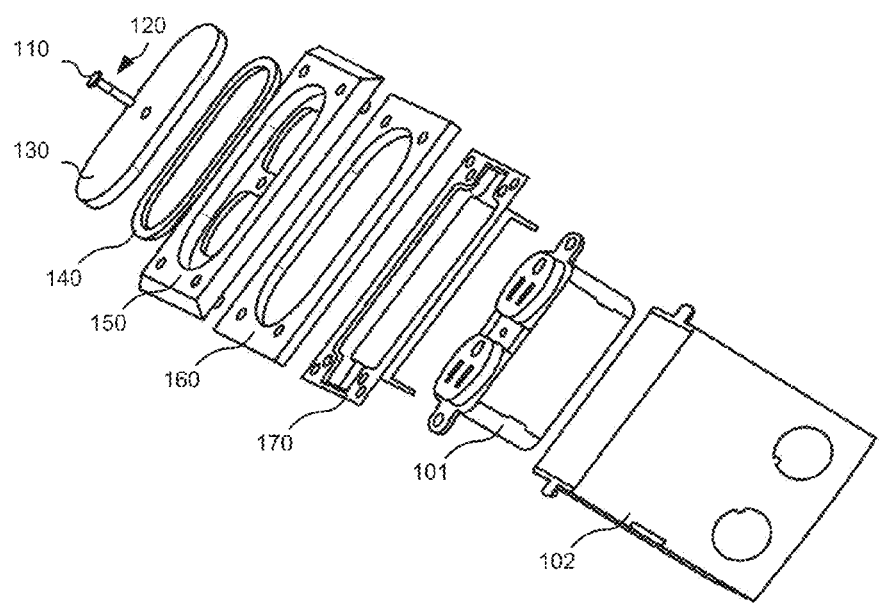

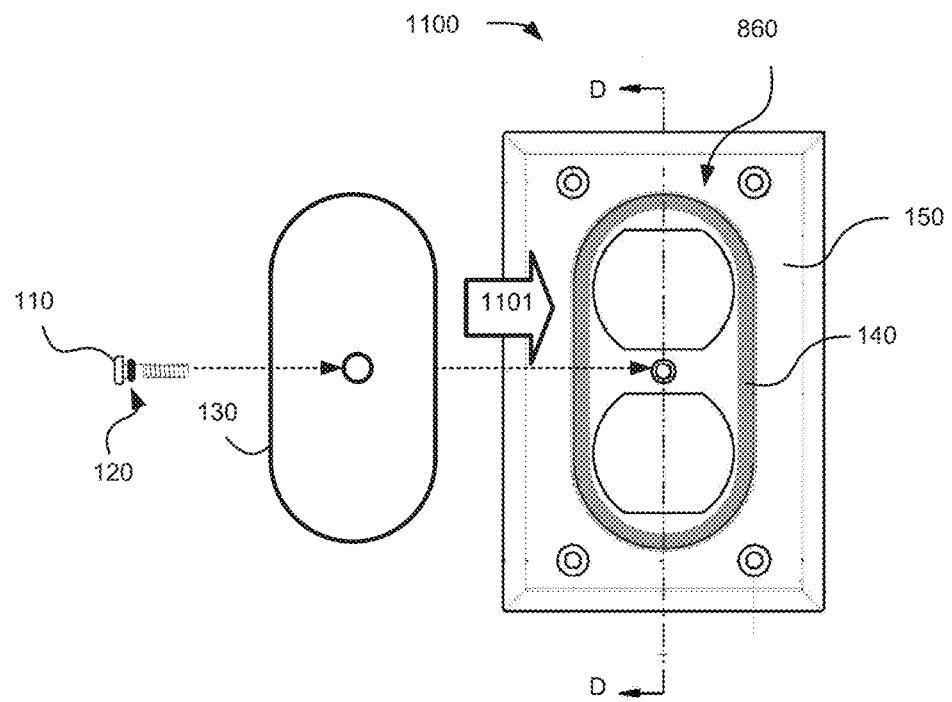

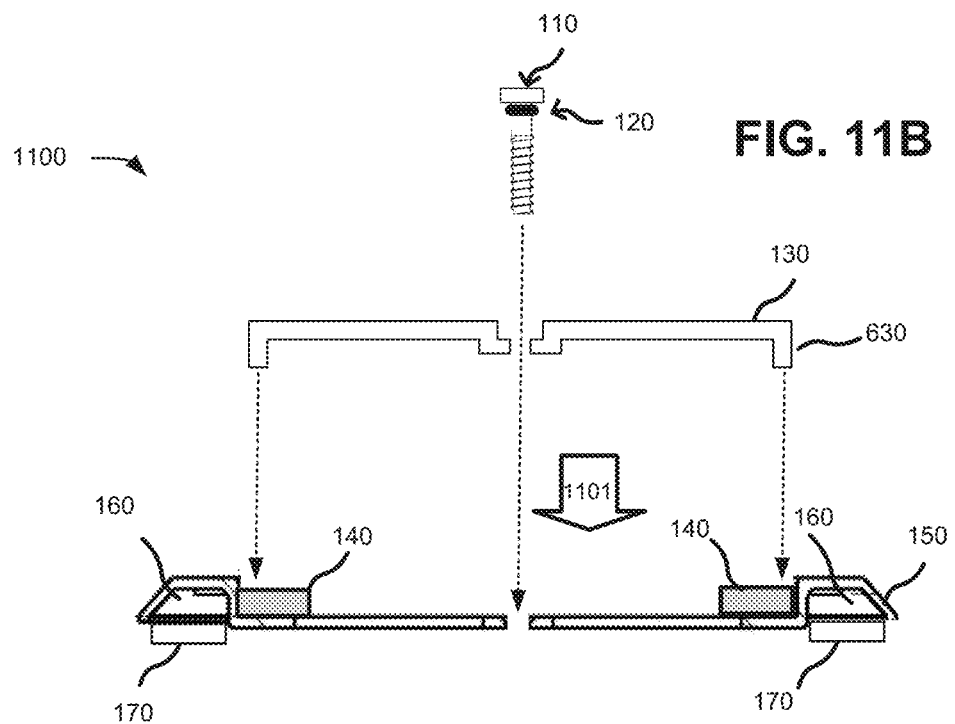

FLOOR BOX COVER

CROSS-REFERENCE TO RELATED APPLICATION

This application claims priority under 35 U.S.C. §119 to Chinese Patent Application No. 201410290522.X, filed on Jun. 25, 2014, the disclosure of which is herein incorporated by reference.

BACKGROUND INFORMATION

An electrical box, also referred to as a junction or outlet, may accommodate electrical cable terminations and electrical components, such as electrical receptacles, jacks, plugs and other devices. For example, the electrical box may permit electrical cables to connect to electrical components housed within the electrical box. When an electrical box is installed in a floor, the electrical box may be referred to as a floor box. A floor box may include a lid, or cover, to conceal and protect the electrical components included within the floor box. A lid may be secured to the floor box using a latch or other connector, and the lid may be opened or removed from the floor box to permit selective access to the electrical components.

BRIEF DESCRIPTION OF THE DRAWINGS

FIG. 1 provides an exploded perspective view of an exemplary floor box cover according to an implementation;

FIGS. 11A and 11B show, respectively, a top view and a cross-sectional view (along line D-D in FIG. 11A) of an exemplary third portion of the floor box cover shown in FIG. 1 according to one implementation.

DETAILED DESCRIPTION OF PREFERRED EMBODIMENTS

Figure 2A:
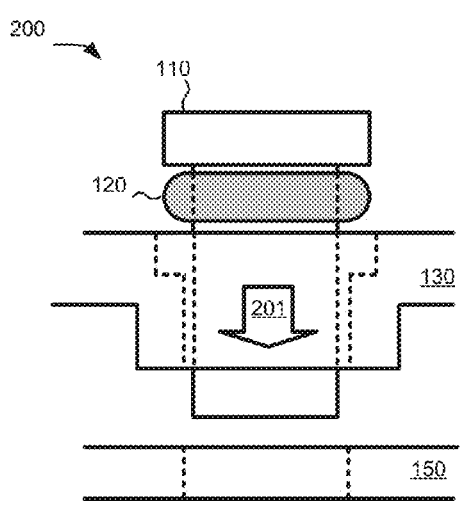
FIGS. 2A and 2B show side views of an exemplary first portion included in the floor box cover of FIG. 1 according to an implementation.

The following detailed description refers to the accompanying drawings. The same reference numbers in different drawings may identify the same or similar elements.

According to implementations described herein, a floor box cover may include a cover, or lid, to prevent access to an electrical device. The floor box cover may include a base plate to secure the electrical device and a cover plate connected to the base plate. The cover plate may include a first opening to expose the electrical device and a second opening to receive the lid. A connector may be inserted into an aperture in the lid and may engage the cover plate to secure the lid within the second opening and to cause the lid to block the first opening. A connector gasket may engage the connector, and when the connector is inserted into the aperture in the lid, connector gasket may be compressed within the aperture to prevent the connector from being easily removed from the lid. A compressible ring gasket may be friction fit within the second opening, and when the connector engages the cover plate, the lid may compress the ring gasket to seal the second opening.

In descriptions herein, the terms "front," "forward," or upward may generally refer to a direction from an electrical box, and the terms "back," "rear," or "backward" may generally refer to a direction toward the electrical box and/or an electrical device positioned within the electrical box.

FIG. 1 provides an exploded perspective view of an exemplary floor box cover 100 according to an implementation described herein. As provided in FIG. 1, floor box cover 100 may include a fastener 110, a fastener gasket 120, a lid 130, a ring gasket 140, a cover plate 150, a planar gasket 160, and a base plate 170 that combine to attach to almost any type of an electrical device 101 and/or an electrical box 102. The particular arrangement and number of components of floor box cover 100 shown in FIG. 1 are illustrated for simplicity. In practice, floor box cover 100 may include additional, fewer, and/or different components than shown in FIG. 1.

As shown in FIG. 1, floor box cover 100 may include fastener 110 that may be inserted through an aperture in lid 130. Fastener gasket 120 may be positioned on fastener 110, and when fastener 110 is inserted through the aperture in lid 130, fastener gasket 120 may help prevent fastener 110 from being separated from lid 130 prior to or after installation of floor box cover 100. At the same time, fastener 110 may, when inserted through the aperture in lid, or cover, 130, move (e.g., rotate) to engage cover plate 150 and/or electrical device 101 to secure lid 130 against cover plate 150. When lid 130 is secured against cover plate 150, lid 130 may prevent access to electrical device 101. Conversely, when fastener 110 is not secured to cover plate 150 and/or electrical device 101, lid 130 may be removed from cover plate 150, allowing a user to access electrical device 101

As also shown in FIG. 1, ring gasket 140 may be positioned between lid 130 and cover plate 150. Ring gasket 140 may form a seal between lid 130 and cover plate 150 to help prevent contaminants (e.g., water and/or dust) from reaching electrical device 101 and/or wires within electrical box 102. For example, fastener 110, when engaging cover plate 150, may cause ring gasket 140 to be compressed between lid 130 and cover plate 150. Fastener gasket 120 may also help seal an aperture in lid 130 (e.g., the aperture for receiving fastener 110) to further prevent contaminants from reaching electrical device 101 and/or wires within electrical box 102.

As further shown in FIG. 1, cover plate 150 may be connected to base plate 170, and in turn, base plate 170 may connect electrical device 101 to electrical box 102. Planar gasket 160 may be positioned between cover plate 150 and base plate 170 to further seal floor box cover 100. Electrical box 102 may be positioned within a surface, such as a floor within a building, and electrical device 101 may be installed within electrical box 102. Electrical device 101 may include, for example, an electrical receptacle for receiving a plug. Although shown in FIG. 1 as providing two electrical outlets, electrical device 101 may include almost any possible number of electrical and/or communications connections.

Figure 2B:
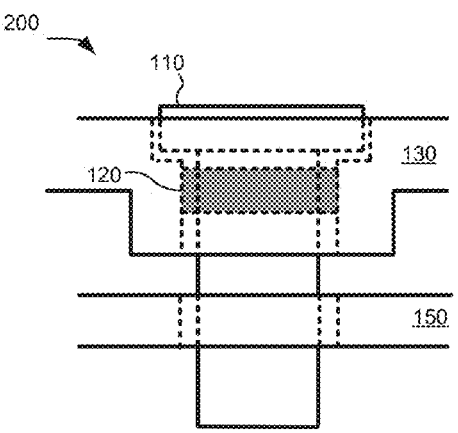

FIGS. 2A and 2B show side views of an exemplary first portion 200 of floor box cover 100 according to one implementation. As shown in FIGS. 2A and 2B, first portion 200 may include fastener 110, fastener gasket 120, lid 130, and cover plate 150. In FIGS. 2A and 2B, fastener 110 may be inserted through an aperture in lid 130, and fastener gasket 120 may be positioned on fastener 110. The particular arrangement and number of components of first portion 200 shown in FIGS. 2A and 2B are illustrated for simplicity. In practice, first portion 200 may include additional, fewer, and/or different components than shown in FIGS. 2A and 2B.

FIG. 2A shows first portion 200 when lid 130 is in an unsecured position (e.g., fastener 110 is not engaged to cover plate 150 such that lid 130 may be removed from cover plate 150). Fastener 110 may be inserted through an aperture in lid 130 in a direction illustrated by arrow 201 in FIG. 2A. Fastener gasket 120 may be positioned on and engage fastener 110.

Furthermore, fastener 110 may be shaped to limit the extent that fastener 110 can move in the direction illustrated by arrow 201 through the aperture in lid 130. For example, fastener 110 may include an annular structure that is larger than at least a portion of the aperture of lid 130 to function as a bearing surface that prevents fastener 110 from entirely passing through lid 130 in the direction illustrated by arrow 201. At the same time, fastener 110 may move to connect to cover plate 150. For example, fastener 110 may rotate to engage an opening in cover plate 150.

FIG. 2B shows first portion 200 when lid 130 is in a secured position (e.g., fastener 110 is engaged to cover plate 150 such that lid 130 may not be removed from cover plate 150). In one implementation, fastener gasket 120 may be configured (e.g., composed of a flexible material such as rubber, black sponge, cork, synthetic rubber, or another compressible material and/or have a sufficiently small dimension) to enable fastener gasket 120 (when fastener 110 is inserted through the aperture in lid 130) to also be inserted through the aperture in lid 130 along with fastener 110. As shown in FIG. 2B, fastener gasket 120 may be configured to compress to fit within the aperture in lid 130. Fastener gasket 120 may be further configured (e.g., have a dimension when compressed within the aperture in lid 130) to prevent fastener 110 from being easily removed and/or inadvertently lost from the opening in lid 130.

Furthermore, fastener gasket 120, when compressed within the aperture in lid 130, may seal the aperture to prevent inadvertent contamination via the aperture. In this way, lid 130 may be manufactured using a less precise technique, such as stamping, that may cause aperture in lid 130 to be potentially larger or more variable in size, but fastener gasket 120 may be used to seal the aperture and to secure fastener 110 within the aperture.

Figure 3:
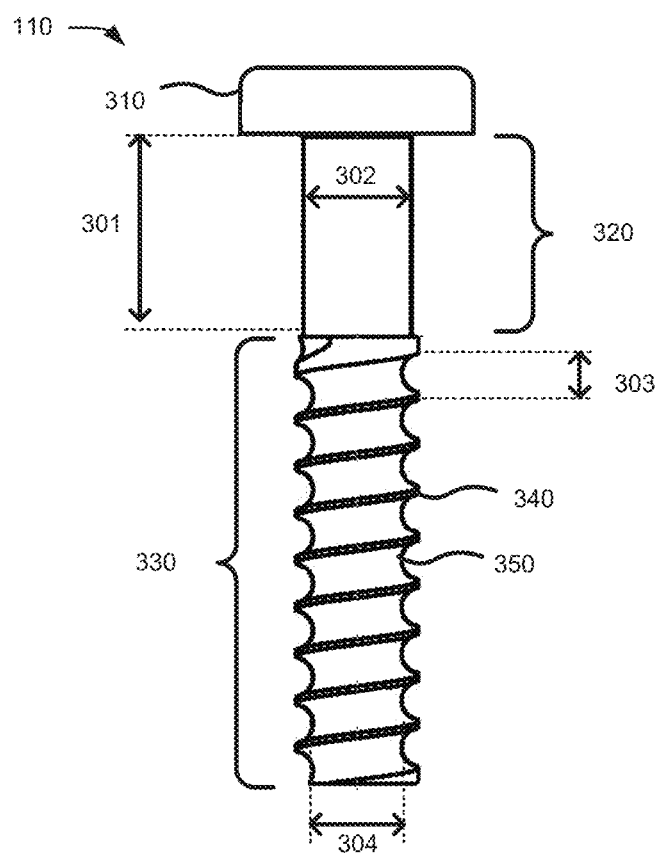
FIG. 3 shows a side view of an exemplary fastener included in the floor box cover of FIG. 1 according to an implementation.

FIG. 3 shows a side view of an exemplary fastener 110 according to an implementation described herein. As shown in FIG. 3, fastener 110 may include a head 310, a non-threaded shaft portion 320, and a threaded shaft portion 330. The particular arrangement and number of components of fastener 110 shown in FIG. 3 are illustrated for simplicity. In practice, fastener 110 may include additional, fewer, and/or different components than shown in FIG. 3. Fastener 110 may be composed of a metal material (e.g., bronze, stainless steel, zinc-coated steel, etc.) and/or a non-metal material (nylon, plastic, polycarbonate, composite, ceramic, etc.).

As shown in FIG. 3, head 310 may include an annular structure that extends from non-threaded shaft portion 320 and a portion of head 310 may function as a bearing surface to prevent fastener 110 from entirely passing through the aperture in lid 130. Head 310 may further include one or more slots or other structure and/or head 310 may specially shaped (e.g., to provide one or more bearing surfaces) to receive a turning force that causes fastener 110 to be turned or driven into the aperture in lid 130, an aperture in cover plate 150, and/or electrical device 101.

Continuing with FIG. 3, non-threaded shaft portion 320 may be connected to head 310. Non-threaded shaft portion 320 may have a sufficient shaft length 301 so that threaded shaft portion 330 may extend through the opening in lid 130 when fastener 110 is inserted into the opening, allowing fastener 110 to rotate within the aperture (e.g., when a force is applied to head 310). Non-threaded shaft portion 320 may have a shaft width 302 that is sufficiently small to allow fastener 110 to be inserted into the opening in lid 130. In one implementation, shaft width 302 may be sufficiently large to hold to fastener gasket 120 in a desired position (e.g., to prevent fastener gasket 120 from being removed from fastener 110).

As further shown in FIG. 3, threaded shaft portion 330 may be connected to a distal (e.g., opposite of head 310) end of non-threaded shaft portion 320. Threaded shaft portion 330 may include helical ridges 340, also known as threads, formed around the circumference of a cylinder 350. Helical ridge 340 may be sized and/or shaped to engage, for example, a portion of lid 130, cover plate 150, and/or electrical device 101. In one implementation, helical ridge 340 may have a ridge spacing 303 that enables fastener gasket 120 to fit within helical ridges 340. For example, ridge spacing 303 may be sufficiently large to accommodate a thickness of fastener gasket 120. Furthermore, cylinder 350 may have a cylinder width 304 that forms a friction fit with fastener gasket 120 to prevent fastener gasket 120 from being easily removed from fastener 110. In another implementation, fastener 110 may include a ridge or other structure (not shown) to secure fastener gasket 120 on fastener 110.

Figure 4A:
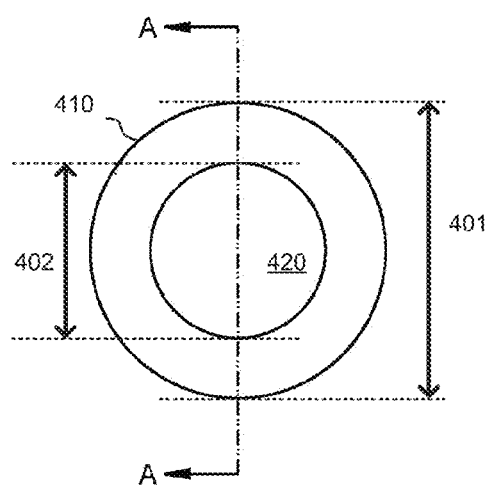
FIGS. 4A and 4B show, respectively, a top view and a cross-sectional view (along line A-A of FIG. 4A) of an exemplary ring gasket included in the floor box cover of FIG. 1 according to an implementation.
Figure 4B:
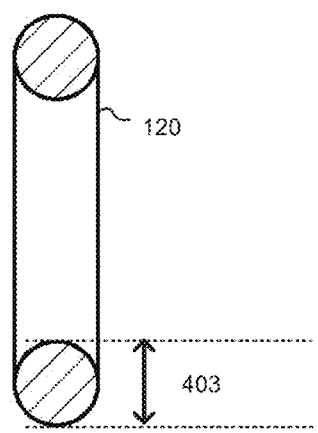

FIGS. 4A and 4B show, respectively, a top view and a cross-sectional view (along line A-A of FIG. 4A) of an exemplary fastener gasket 120 according to one implementation. As shown in FIG. 4A, fastener gasket 120 may include a toroidal structure 410 that has an outer radius of 401 and an inner radius of 402 (associated with a circular opening 420). As shown in FIG. 4B, toroidal structure 410 may be a substantially torus-shape having radial width 403. Fastener gasket 120 may be composed of a metal material (e.g., bronze, stainless steel, zinc-coated steel, etc.) and/or a non-metal material (nylon, plastic, rubber, black sponge, cork, synthetic rubber, polycarbonate, composite, ceramic, etc.). In one implementation, fastener gasket 120 may be composed of a deformable and/or elastic material that allows fastener gasket 120 to be compressed to fit within an opening in lid 130. The particular arrangement and number of components of fastener gasket 120 shown in FIGS. 4A and 4B are illustrated for simplicity. In practice, fastener gasket 120 may include additional, fewer, and/or different components than shown in FIGS. 4A and 4B.

Figure 5:
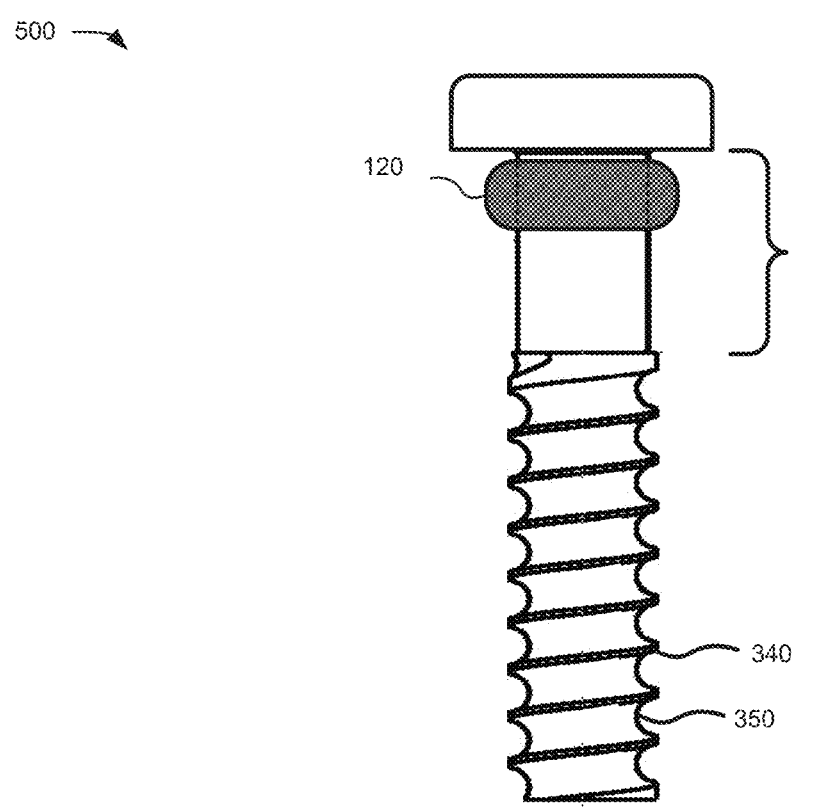
FIG. 5 show an exemplary second portion of the floor box cover of FIG. 1 according to an implementation.

FIG. 5 show an exemplary second portion 500 of floor box cover 100 according to one implementation. As shown in FIG. 5, second portion 500 may include fastener 110 and fastener gasket 120. The particular arrangement and number of components of second portion 500 shown in FIG. 5 are illustrated for simplicity. In practice, second portion 500 may include additional, fewer, and/or different components than shown in FIG. 5.

As shown in FIG. 5, fastener gasket 120 may be positioned on non-threaded shaft portion 320 (FIG. 3) of fastener 110. Inner width 402 (FIG. 4) of fastener gasket 120 may be selected to correspond to and/or be slightly smaller than shaft width 302 of non-threaded shaft portion 320 (FIG. 3), so that fastener gasket 120 can be friction fit onto non-threaded shaft portion 320. This configuration may prevent fastener gasket 120 from being easily removed from fastener 110.

In one implementation, inner width 402 (FIG. 4A) of fastener gasket 120 may be smaller than cylinder width 304 associated with cylinder 350 (FIG. 3) of fastener 110 to prevent fastener gasket 120 from being easily moved from non-threaded shaft portion 320 to threaded shaft portion 330. In addition or alternatively, radial width 403 (FIG. 4B) of fastener gasket 120 may be greater than ridge spacing 303 (FIG. 3) and/or a curvature of fastener gasket 120 may be larger than a curvature of helical ridges 340 (FIG. 3) to prevent fastener gasket 120 from easily moving to threaded shaft portion 330 from non-threaded shaft portion 320. In another implementation, fastener 110 may include a ridge, lip, or other structure between non-threaded shaft portion 320 and threaded shaft portion 330 to prevent movement of fastener gasket 120.

Figure 6A:
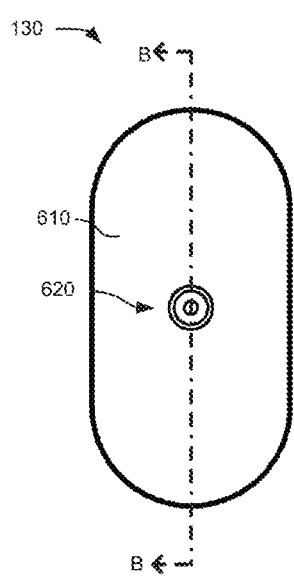
FIGS. 6A-6C show, respectively, a top view, a rear-perspective view, and a cross-sectional view (along line B-B of FIG. 6A) of an exemplary lid included in the floor box cover of FIG. 1 according to one implementation.
Figure 6B:
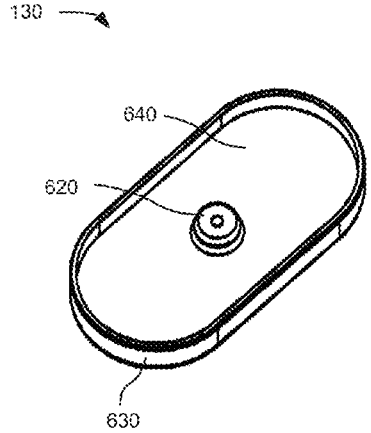
Figure 6C:
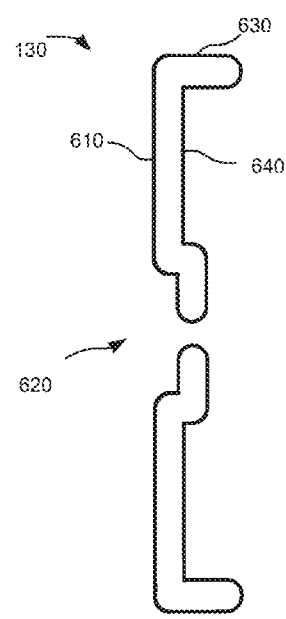

FIGS. 6A-6C show, respectively, a top view, a rear perspective view, and a cross-sectional view (along line B-B of FIG. 6A) of an exemplary lid 130 according to one implementation. As shown in FIGS. 6A-6C, lid 130 may include, for example, a top lid surface 610, lid aperture 620, a rib 630, and a rear lid surface 640. Lid 130 may be composed of a metal material (e.g., bronze, stainless steel, zinc-coated steel, etc.) and/or a non-metal material (nylon, plastic, polycarbonate, composite, ceramic, etc.). For example, lid 130 may be stamped from a sheet of malleable metal with a pre-threaded aperture 620. The particular arrangement and number of components of lid 130 shown in FIGS. 6A-6E are illustrated for simplicity. In practice, lid 130 may include additional, fewer, and/or different components than shown in FIGS. 6A-6E.

As shown in FIGS. 6A-6C, top lid surface 610 is generally planar and may include aperture 620 to receive fastener 110. Top lid surface 610 (shown in FIG. 6A-6C as having a generally elliptical shape) may be shaped to fit within a recessed portion of cover plate 150 to prevent access to electrical device 101 when lid 130 is installed on cover plate 150 (e.g., by engaging fastener 110 to cover plate 150).

As described above with respect to FIGS. 2A and 2B, lid aperture 620 may be sufficiently large to receive fastener 110 and, at the same time, sufficiently small to prevent fastener 110 from being removed when fastener gasket 120 is installed on fastener 110. Aperture 620 may include a structure (not shown), such as an internal thread to engage the external threads included in helical threaded shaft portion 330 (FIG. 3) of fastener 110. As also shown in FIGS. 6A-6C, aperture 620 may include a bearing surface to meet a corresponding portion of fastener 110 (e.g., head 310 shown in FIG. 3) to provide a downward force on lid 130 toward electrical device 101 when fastener 110 engages cover plate 150. In one implementation, aperture 620 may be positioned substantially in the center of top lid surface 610.

In one implementation shown in FIGS. 6B and 6C, lid 130 may be formed in a stamping process that may cause a portion of rear lid surface 640 to extend toward cover plate 150. For example, this portion of rear lid surface 640 may include a shape that corresponds to the shape of head 310. As described with respect to FIG. 2B, this extended portion of rear lid surface 640, associated with aperture 620, and cover plate 150 may compress fastener gasket 120 when fastener 110 engages cover plate 150 to prevent water and other contaminants associated from passing through aperture 620. Similarly, when lid 130 is installed on cover plate 150, this extended portion of lid 130, cover plate 150, and fastener gasket 120 may combine to provide a support that may prevent lid 130 from deforming near aperture 620 when a force is applied to top lid surface 610 (e.g., when a person steps on the floor box cover 100).

As shown in FIGS. 6B and 6C, lid 130 may include rib 630 on rear lid surface 640. Rib 630 may be positioned at a peripheral edge of rear lid surface 640. Rib 630 may provide a structural support to help prevent lid 130 from deforming near the peripheral edge of lid 130 when a force is applied to top lid surface 610 (e.g., when a person steps on the floor box cover 100). Rib 630 may have a sufficient height such that rear lid surface 640 does not contact electrical device 101 when lid 130 is installed in floor box cover 100.

Although described herein as being separate from cover plate 150, lid 130 may be movably connected to cover plate 150 via a hinge, swing arm, or other connecting component, and fastener 110 may secure lid 130 to cover plate 150.

Figure 7A:
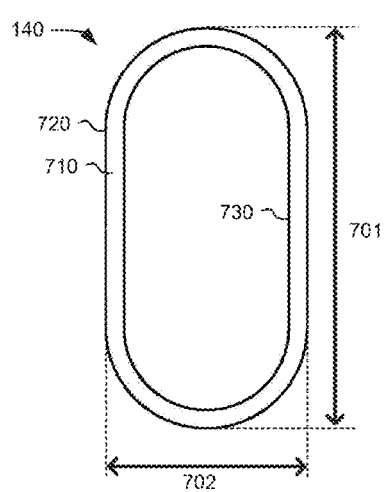
FIGS. 7A-7C show, respectively, a top view, a top perspective view, and a side view of a ring included in the floor box cover of FIG. 1 according to one implementation.
Figure 7B:
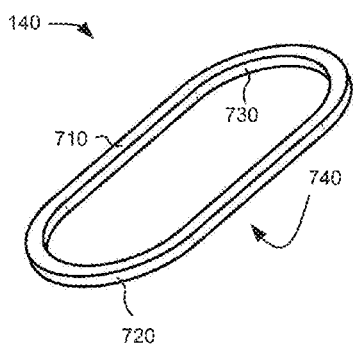
Figure 7C:
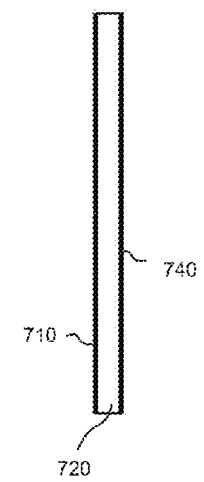

FIGS. 7A-7C show, respectively, a top view, a top perspective view, and a side view of an exemplary ring gasket 140 according to one implementation. As shown in FIGS. 7A-7C, ring gasket 140 may include, for example, an upper ring surface 710, an outer ring wall 720, an inner ring wall 730, and a lower ring surface 740. Ring gasket 140 may be composed of a compressible material, such as a non-metal material such as nylon, plastic, polycarbonate, rubber, black sponge, cork, synthetic rubber, composite, ceramic, etc. Alternatively, ring gasket 140 may be composed of a metal material such as bronze, stainless steel, zinc-coated steel, etc. The particular arrangement and number of components of ring gasket 140 shown in FIGS. 7A-7C are illustrated for simplicity. In practice, ring gasket 140 may include additional, fewer, and/or different components than shown in FIGS. 7A-7C.

As shown in FIGS. 7A-7C, ring gasket 140 may have a generally oval shape that has a ring width 702 and ring length 701, and the shape of ring gasket 140 may correspond to the shape of a portion of lid 130 (e.g., rib 630 shown in FIGS. 6B-6E) and/or a recess in cover plate 150. At least one of ring width 702 or ring length 701 may be relatively larger than a corresponding dimension of the recess in cover plate 150 so that ring gasket 140 is friction fit within the recess in cover plate 150.

Ring gasket 140 may be positioned between lid 130 and cover plate 150. Fastener 110, when engaging cover plate 150, may cause a portion of lid 130 (e.g., rib 630) to contact upper ring surface 710, and cause a portion of cover plate 150 to contact lower ring surface 740. For example, ring gasket 140 may form a seal between rib 630 and cover plate 150 to help prevent contaminants (e.g., water and/or dust) from contacting electrical device 101 and/or wires within electrical box 102.

Figure 8A:
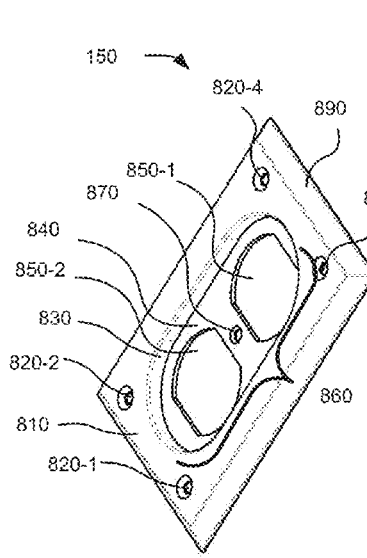
FIGS. 8A-8C show, respectively, a top perspective view, a top view, and a cross sectional view (along line C-C of FIG. 8B) of an exemplary cover plate included in the floor box cover of FIG. 1 according to one implementation.
Figure 8B:
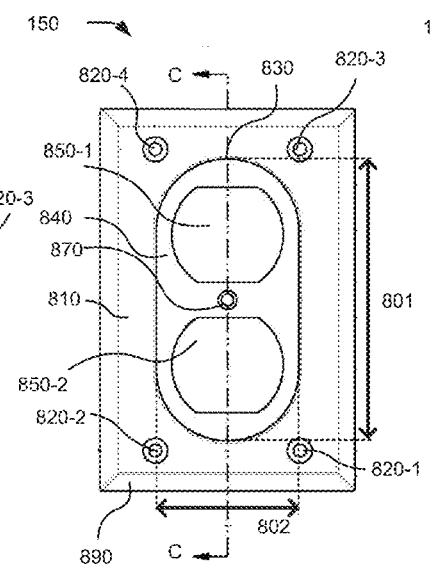
Figure 8C:
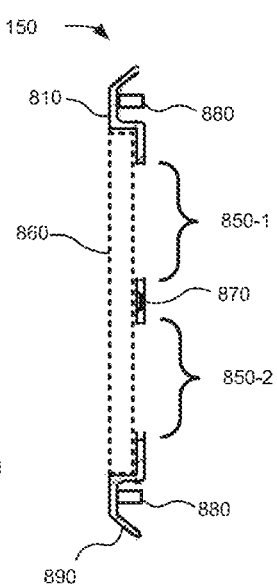

FIGS. 8A-8C show, respectively, a top perspective view, a top view, and cross sectional view (along line C-C of FIG. 8B) of an exemplary cover plate 150 according to one implementation. As shown in FIGS. 8A-8C, cover plate 150 may include a top plate surface 810, cover plate apertures 820 (shown in FIGS. 8A and 8B as apertures 820-1, 820-2, 820-3, and 820-4), a vertical plate wall 830, a base plate wall 840 that includes device openings 850 (shown in FIGS. 8A-8C as device opening 850-1 and 850-2), an access opening 860, a plate aperture 870, one or more protrusions 880, and bevel 890.

Cover plate 150 may be composed of a metal material (e.g., bronze, stainless steel, zinc-coated steel, etc.) and/or a non-metal material (nylon, plastic, polycarbonate, composite, ceramic, etc.). For example, cover plate 150 may be stamped from a sheet of malleable metal. The particular arrangement and number of components of cover plate 150 shown in FIGS. 8A-8C are illustrated for simplicity. In practice, cover plate 150 may include additional, fewer, and/or different components than shown in FIGS. 8A-8C.

As shown in FIGS. 8A-8C, top plate surface 810 may be substantially planar and may include plate apertures 820 that receive a screw or other type of connector to attach cover plate 150 to one or more other components of floor box cover 100 (e.g., to base plate 170). Top plate surface 810 may extend to bevel 890. Top plate surface 810 and bevel 890 may provide a smooth transition between floor box cover 100 and an underlying flooring surface. A back surface (not shown) of cover plate 150 may rests upon the flooring surface.

Base plate wall 840 may be recessed from top plate surface 810 by vertical plate wall 830. Base plate wall 840 may include plate aperture 870 that is configured to receive and engage threaded portion 330 of fastener 110. Base plate wall 840 may also include device openings 850 to provide access to electrical device 101 when lid 130 is not installed in floor box cover 100. Openings 850 may provide access to electrical device 101 when lid 130 is not installed in floor box cover 100.

As further shown in FIGS. 8A-8C, top plate surface 810 may combine with vertical plate wall 830 and base plate wall 840 to define access opening 860. Access opening 860 may be sized to receive lid 130 and ring gasket 140. For example, at least one access opening length 801 or access opening width 802 may correspond, respectively, to ring width 702 or ring length 701. In one implementation, at least one of ring length 701 or ring width 702 may be relatively larger than, respectively, access opening length 801 or access opening width 802 in cover plate 150 so that ring gasket 140 may be friction fit within access opening 870.

As shown in FIGS. 8A-8C, bevel or slanted plate surface 890 may extend from top plate surface 810 and may combine with vertical plate wall 830 to define a cavity to receive planar gasket 160. As further shown in FIG. 8C, one or more protrusions 880 may extend from a rear portion of top plate surface 810. Protrusions 880 may engage apertures in planar gasket 160 when planar gasket 160 is inserted into the back cavity defined by top plate surface 810, vertical plate wall 830, and bevel 890.

Furthermore, a back surface (not shown) of cover plate 150 may sit upon the flooring surface to disperse weight applied to cover plate 150 to the flooring surface (e.g., if a person or item is positioned on floor box cover 100).

Although FIGS. 8A-8C show cover plate 150 as having a generally rectangular shape to mate to base plate 170 (shown in FIG. 10A), it should be appreciated that cover plate 150 may be shaped as desired. For example, top plate surface 810 may extend to bevel 890, and top plate surface 810 may extend laterally in one or more directions so that bevel 890 may have a non-rectangular shape, such as to include a substantially round shape.

Figure 9:
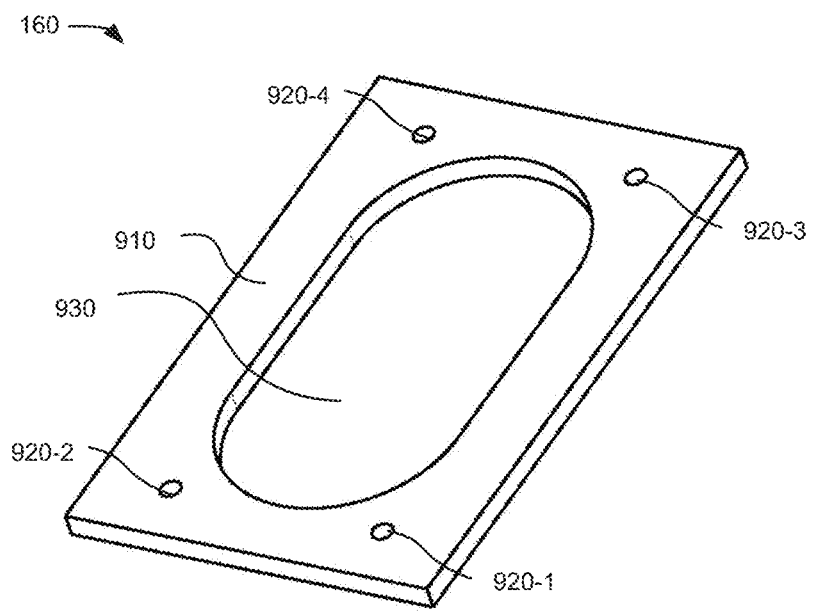
FIG. 9 shows an exemplary planar gasket included in the floor box cover of FIG. 1 according to one implementation.

FIG. 9 shows an exemplary planar gasket 160 according to one implementation. As shown in FIG. 9, planar gasket 160 may include a material sheet 910, gasket apertures 920 (shown in FIG. 9 as gasket apertures 920-1, 920-2, 920-3, and 920-4), and gasket opening 930. Planar gasket 160 may be composed of a compressible non-metal material (nylon, plastic, polycarbonate, composite, ceramic, etc.). In another implementation, planar gasket 160 may be composed a metal material (e.g., bronze, stainless steel, zinc-coated steel, etc.). The particular arrangement and number of components of planar gasket 160 shown in FIG. 9 are illustrated for simplicity. In practice, planar gasket 160 may include additional, fewer, and/or different components than shown in FIG. 9.

As shown in FIG. 9, planar gasket 160 may include a substantially planar material sheet 910. Material sheet 910 may include gasket apertures 920 to engage protrusions 880 to position and hold planar gasket 160 at a desired position relative to planar gasket 160. Material sheet 910 may further include gasket opening 930. Gasket opening 930 may fit on the rear surface of cover plate 150, and may correspond in size and shape to access opening 860.

Figure 10:
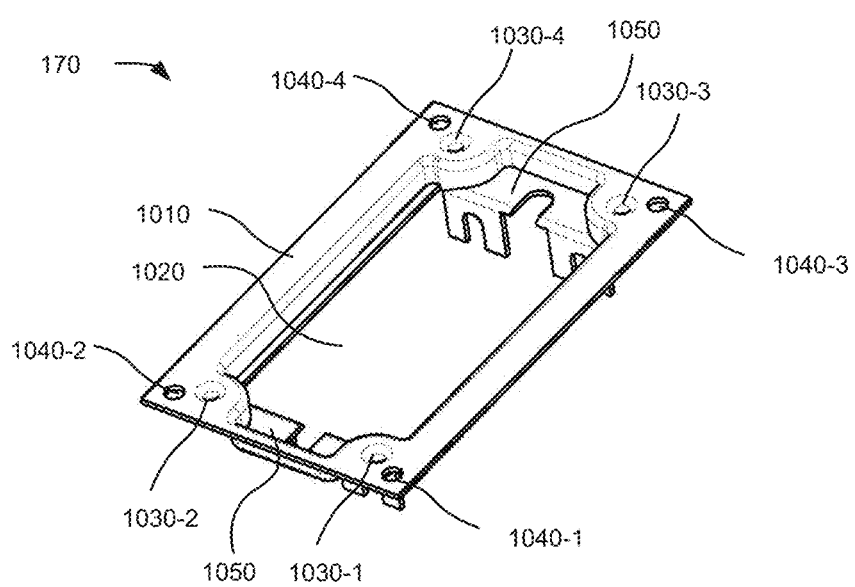
FIG. 10 shows an exemplary base plate included in the floor box cover of FIG. 1 according to one implementation.

FIG. 10 shows an exemplary base plate 170 according to one implementation. As shown in FIG. 10, base plate 170 may include a base layer 1010 with a base opening 1020, first base apertures 1030 (shown in FIG. 10 as first base apertures 1030-1, 1030-2, 1030-3, and 1030-4), second base apertures 1040 (shown in FIG. 10 as second base apertures 1040-1, 1040-2, 1040-3, and 1040-4), and base mounting layer 1050. The particular arrangement and number of components of base plate 170 shown in FIG. 10 are illustrated for simplicity. In practice, base plate 170 may include additional, fewer, and/or different components than shown in FIG. 10. Components of base plate 170 may be composed of a metal material (e.g., bronze, stainless steel, zinc-coated steel, etc.) and/or a non-metal material (nylon, plastic, polycarbonate, composite, ceramic, etc.).

As shown in FIG. 10, base layer 1010 may include a substantially planar surface that includes a base opening 1020 to allow access to electrical device 101 when electrical device 101 is attached to base layer 1010. For example, electrical device 101 and/or electrical box 102 may attach to base mounting layer 1050. For example, base opening 1020 may line up with access opening 860 to enable a user to access electrical device 101 when fastener 110 and lid 130 are removed from cover plate 150. Base layer 1010 may further include, for example, first base apertures 1030 that engage protrusions 880 to secure planar gasket 160 (FIG. 8C) and/or second base apertures 1040 that engage screws (or other connectors) to attach base plate 170 to electrical box 102 and/or cover plate 150.

Base plate 170 may connect to electrical device 101 and/or electrical box 102 at base mounting layer 1050. For example, a screw or other type of connection component may be used to connect electrical device 101 and/or electrical box 102 to base mounting layer 1050.

In another implementation, base layer 1010 may extend laterally in one or more directions from base opening 1020, such as to provide a generally round shape for base plate 170. In one implementation (not shown), electrical box 102 may be an integrally formed portion of base plate 170. For example, electrical box 102 may extended downward (e.g., away from lid 130) from base opening 1020 and be integrally connected to base layer 1010 and/or mounting layer 1050.

FIGS. 11A and 11B show, respectively, a top view and a cross-sectional view (along line D-D in FIG. 11A) of an exemplary third portion 1100 of floor box cover 100 according to one implementation. As shown in FIGS. 11A and 11B, third portion 1100 may include, for example, fastener 110, fastener gasket 120, lid 130, ring gasket 140, cover plate 150, and planar gasket 160. The particular arrangement and number of components of third portion 1100 shown in FIGS. 11A and 11B are illustrated for simplicity. In practice, third portion 1100 may include additional, fewer, and/or different components than shown in FIGS. 11A and 11B.

As shown in FIGS. 11A and 11B, access opening 860 (FIGS. 8A-8C) in cover plate 150 may be sized to receive ring gasket 140 (e.g., so that at least a portion of ring gasket 140 may be inserted into access opening 860). Furthermore, access opening 860 may be sized to receive lid 130 (e.g., so that at least a portion of lid 130 may be inserted into access opening 860). In particular, when lid 130 is inserted into access opening 860 (as illustrated by arrow 1101), rib 630 may contact ring gasket 140 to apply pressure in direction associated with arrow 1101 to form a seal between lid 130 and cover plate 150.

As further shown in FIG. 11B, planar gasket 160 may be positioned in a back cavity defined by top plate surface 810, vertical plate wall 830, and bevel 890 to further seal cover plate 150 against electrical box 102. Planar gasket 160 may be secured in the back cavity by base plate 170.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, although electrical device 101 is depicted as an electrical outlet in FIG. 1, floor box cover may connect to a variety of different types of electrical devices 101, such as a light switch, a ground fault circuit interruption (GFCI) device, a dimmer switch, a timer, a data/phone/cable connection, etc.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. An apparatus comprising:
    a base plate adapted for mounting to an electrical device;
    a cover plate configured to connect to the base plate, wherein the cover plate includes:
        a top plate surface,
        a vertical plate wall that extends away from the top plate surface toward the electrical device, and
        a base plate wall connected to the vertical plate wall that includes a device opening to expose at least a portion of the electrical device, wherein the base plate wall includes a plate aperture, and wherein the vertical plate wall defines at least a portion of an access opening, the access opening extending from the base plate wall and through the top plate surface and being in direct communication with the device opening;
    a ring gasket configured to be friction fit within the access opening;
    a cover that includes a cover aperture, wherein the cover is configured to be inserted within the access opening, and wherein the cover, when inserted within the access opening, blocks the device opening; and
    a connector configured to be inserted within the cover aperture and the plate aperture and to securely engage at least the electrical device,
    wherein, when the cover is inserted though the access opening and the connector is inserted through the cover aperture and engages the at least the electrical device, the cover compresses the ring gasket within the access opening to seal the access opening.

2. The apparatus of claim 1, further comprising:
    a connector gasket comprising a compressible material, wherein, the connector gasket is configured to be inserted on the connector, wherein the connector gasket prevents the connector from being removed from the cover aperture and allows the connector to be rotated to engage at least the electrical device.

3. The apparatus of claim 2, wherein the connector gasket is compressed within the access opening to seal the access opening when the connector is inserted through the cover aperture and engages at least the electrical device.

4. The apparatus of claim 2, wherein the connector includes a non-threaded portion and a threaded portion, and the connector gasket is positioned on the non-threaded portion.

5. The apparatus of claim 1, wherein a rib is attached to a lower surface of the cover, and wherein the rib compresses the ring gasket when the cover is inserted though the access opening and the connector is inserted through the cover aperture and engages at least the electrical device.

6. The apparatus of claim 1, wherein the base plate includes a base aperture and the cover plate further includes a cover plate aperture, and
    wherein a connection device, when inserted through the cover plate aperture and engages the base aperture, couples the base plate to the cover plate.

7. The apparatus of claim 1, wherein the base plate further includes a base layer that includes a base opening to enable access to the electrical device.

8. The apparatus of claim 1, wherein the cover plate further includes a beveled edge at a periphery of the cover plate.

9. The apparatus of claim 1, wherein the cover plate further includes a protrusion that extends from a back surface of the cover plate to position a planar gasket between the cover plate and the base plate.

10. The apparatus of claim 9, wherein the base plate further includes an aperture to receive the protrusion when the cover plate is connected to the base plate.

11. An apparatus comprising:
    a base plate adapted for mounting to an electrical device;
    a cover plate configured to connect to the base plate, wherein the cover plate includes:
        a top plate surface,
        a vertical plate wall that extends toward the electrical device and from the top plate surface, and
        a base plate wall connected to the vertical plate wall and that includes a device opening to expose at least a portion of the electrical device, wherein the base plate wall includes a plate aperture, and wherein the vertical plate wall defines at least a portion of an access opening, the access opening extending from the base plate and through the top plate surface and being in direct communication with the device opening;
a cover that includes a cover aperture, wherein the cover is configured to be inserted within the access opening, and wherein the cover, when inserted within the access opening, blocks the device opening;
a connector configured to be inserted within the cover aperture and the plate aperture and securely engage at least the electrical device; and
a connector gasket coupled to the connector, wherein the connector gasket prevents the connector from being easily removed from the cover aperture and allows the connector to be rotated to engage at least the electrical device.

12. The apparatus of claim 11, wherein the connector gasket comprises a compressible material and is configured to be compressed within the cover aperture to seal the cover aperture when the connector is inserted through the cover aperture and engages at least the electrical device.

13. The apparatus of claim 11, further comprising a ring gasket configured to be friction fit within the access opening, wherein, when the cover is inserted though the access opening and the connector is inserted through the cover aperture and engages at least the electrical device, the cover compresses the ring gasket within the access opening to seal the access opening.

14. The apparatus of claim 13, wherein a rib is attached to a lower surface of the cover, and wherein the rib compresses the ring gasket when the cover is inserted though the access opening and when the connector is inserted through the cover aperture and engages at least the electrical device.

15. The apparatus of claim 11, wherein the base plate includes a base mounting layer, and wherein the electrical device couples to the base mounting layer.

16. The apparatus of claim 11, wherein the base plate includes a base aperture and the cover plate further includes a cover plate aperture, and wherein a connection device, when inserted through the cover plate aperture and engaging the base aperture, couples the base plate to the cover plate.

17. The apparatus of claim 11, wherein the base plate further includes a base layer that includes a base opening to enable access to the electrical device.

18. The apparatus of claim 11, wherein the cover plate includes a beveled edge at a periphery of the top plate surface.

19. The apparatus of claim 11, wherein the cover plate further includes a protrusion that extends from a back surface of the cover plate to position a planar gasket between the cover plate and the base plate.

20. The apparatus of claim 19, wherein the base plate further includes an aperture to receive the protrusion when the cover plate is connected to the base plate.

* * * * *